(12) United States Patent
Hyung et al.

(10) Patent No.: US 7,655,386 B2
(45) Date of Patent: Feb. 2, 2010

(54) POLYMER HAVING ANTIREFLECTIVE PROPERTIES, HARDMASK COMPOSITION INCLUDING THE SAME, PROCESS FOR FORMING A PATTERNED MATERIAL LAYER, AND ASSOCIATED DEVICE

(75) Inventors: Kyung Hee Hyung, Sungnam-si (KR); Jong Seob Kim, Daejeon Kwangyeok-si (KR); Dong Seon Uh, Seoul (KR); Chang Il Oh, Seongnam-si (KR); Kyong Ho Yoon, Daejeon Kwangyeok-si (KR); Min Soo Kim, Incheon Kwangyeok-si (KR); Jin Kuk Lee, Gunpo-si (KR)

(73) Assignee: Cheil Industries, Inc., Gumi-si, Gyeongsangbuk-do (KR)

( * ) Notice: Subject to any disclaimer, the term of this patent is extended or adjusted under 35 U.S.C. 154(b) by 209 days.

(21) Appl. No.: 12/003,152

(22) Filed: Dec. 20, 2007

(65) Prior Publication Data

US 2008/0153033 A1 Jun. 26, 2008

(30) Foreign Application Priority Data

Dec. 20, 2006 (KR) ....................... 10-2006-0131034

(51) Int. Cl.
G03F 7/40 (2006.01)
C08G 61/12 (2006.01)
C07C 2/88 (2006.01)
C07F 9/40 (2006.01)
G03F 7/11 (2006.01)

(52) U.S. Cl. .................. 430/313; 430/317; 430/323; 430/271.1; 430/272.1; 528/205; 528/212; 528/219; 525/481; 525/494; 525/491; 525/492

(58) Field of Classification Search .................. None
See application file for complete search history.

(56) References Cited

U.S. PATENT DOCUMENTS

2006/0251990 A1* 11/2006 Uh et al. .................. 430/270.1
2007/0287821 A1* 12/2007 Doetz et al. .................. 528/8
2008/0255315 A1* 10/2008 Ogura et al. ................ 525/403

FOREIGN PATENT DOCUMENTS

WO WO-2006/025429 A1 * 3/2006

* cited by examiner

Primary Examiner—Cynthia Hamilton
(74) Attorney, Agent, or Firm—Lee & Morse, P.C.

(57) ABSTRACT

An antireflective hardmask composition includes an organic solvent, and at least one polymer represented by Formulae A, B or C:

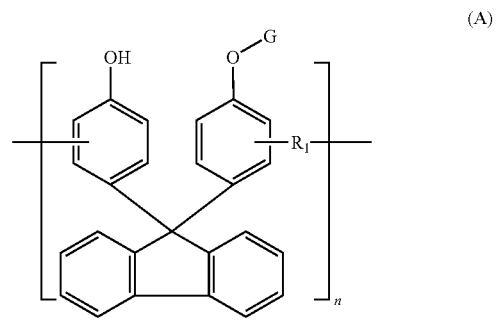

(A)

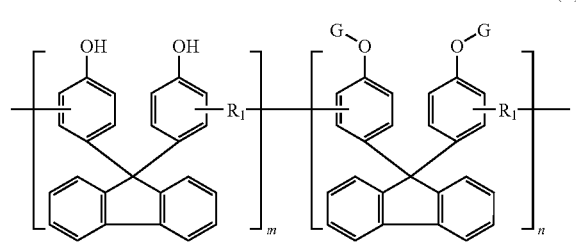

(B)

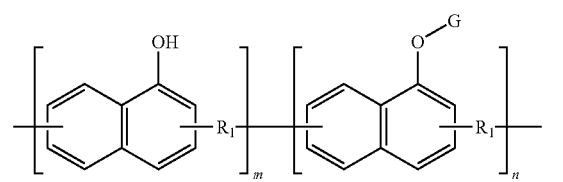

(C)

In Formulae A and B, the fluorene group is unsubstituted or substituted, in Formula C, the naphthalene group is unsubstituted or substituted, n is at least 1 and is less than about 750, m is at least 1, and m+n is less than about 750, G is an aromatic ring-containing group having an alkoxy group, and $R_1$ is methylene or includes a non-fluorene-containing aryl linking group.

19 Claims, 2 Drawing Sheets

POLYMER HAVING ANTIREFLECTIVE PROPERTIES, HARDMASK COMPOSITION INCLUDING THE SAME, PROCESS FOR FORMING A PATTERNED MATERIAL LAYER, AND ASSOCIATED DEVICE

BACKGROUND OF THE INVENTION

1. Field of the Invention

Embodiments relate to a polymer having antireflective properties, a hardmask composition including the same, a process for forming a patterned material layer, and an associated device.

2. Description of the Related Art

Antireflective coating (ARC) materials may be incorporated in an imaging layer used during a lithographic process, in order to minimize reflectivity between the imaging layer and a target material layer during fabrication of a device. However, where the imaging layer incorporating ARC materials and the target material layer have similar compositions, the imaging layer may exhibit poor etch selectivity, such that portions of the imaging layer may be consumed during etching of the target material layer. Accordingly, a hardmask may be included as an intermediate layer, the hardmask being disposed between the imaging layer and the target material layer. The hardmask may receive a pattern from the overlying imaging layer, and may be used to transfer the pattern to the underlying material layer. However, there is a need for hardmask materials that exhibit antireflective properties.

SUMMARY OF THE INVENTION

Embodiments are therefore directed to a polymer having antireflective properties, a hardmask composition including the same, a process for forming a patterned material layer, and an associated device, which substantially overcome one or more of the problems due to the limitations and disadvantages of the related art.

It is therefore a feature of an embodiment to provide a polymer having aromatic ring-containing groups in the backbone.

It is therefore another feature of an embodiment to provide an antireflective hardmask composition including the polymer.

It is therefore another feature of an embodiment to provide a process of fabricating a device using an antireflective hardmask composition, and a device formed using the hardmask composition.

At least one of the above and other features and advantages may be realized by providing a bis(phenyl)fluorene-backbone polymer represented by Formula A or B:

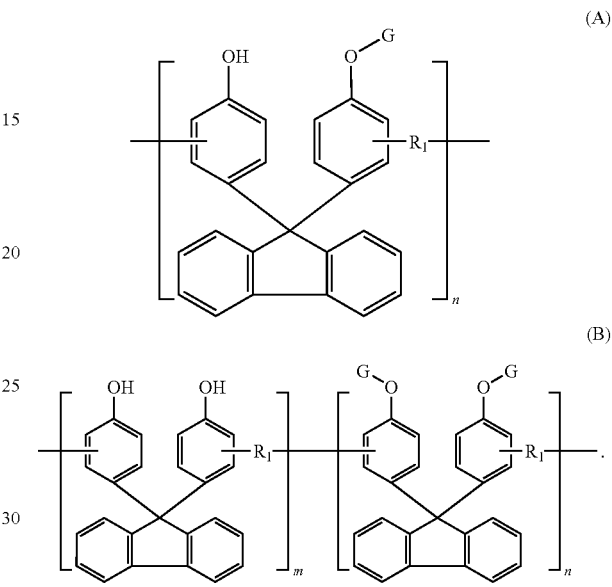

The fluorene group may be unsubstituted or substituted, n may be at least 1 and less than about 750, m may be at least 1, and m+n may be less than about 750, G may be an aromatic ring-containing group having an alkoxy group, and $R_1$ may be methylene or may include a non-fluorene-containing aryl linking group.

The fluorene group may be substituted, such that Formulae A and B are respectively represented by Formulae 1 and 2:

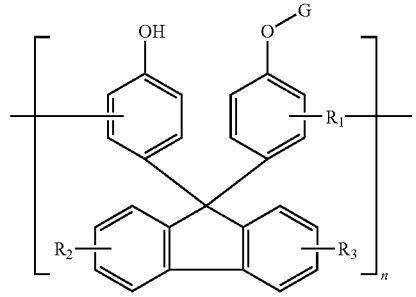

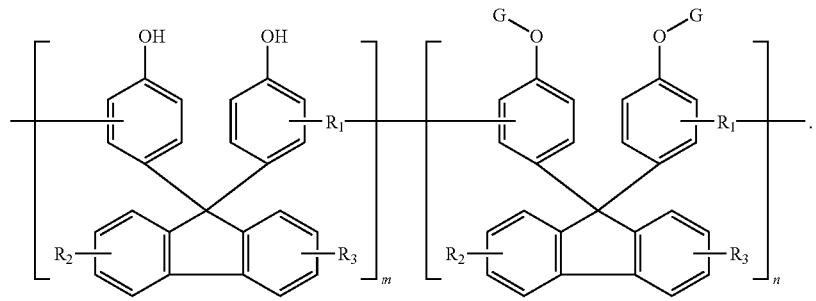

$R_2$ and $R_3$ may be independently a hydroxyl, a hydrocarbon of about 10 carbons or less, or a halogen. At least one of $R_2$ and $R_3$ may be the hydrocarbon of about 10 carbons or less, and the hydrocarbon of about 10 carbons or less may include a $C_1$-$C_{10}$ alkyl group, a $C_6$-$C_{10}$ aryl group, or an allyl group.

G may be:

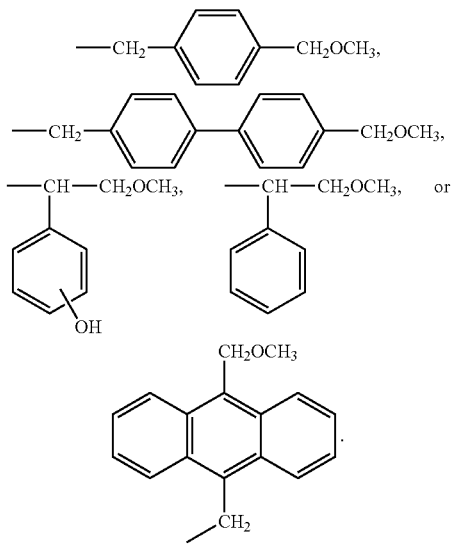

$R_1$ may be:

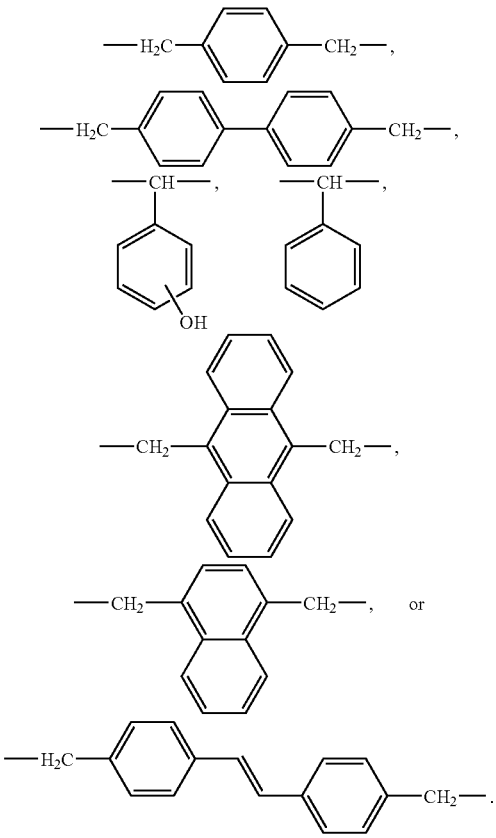

The polymer may have a weight average molecular weight of about 1,000 to about 30,000.

At least one of the above and other features and advantages may also be realized by providing a naphthalene-backbone polymer represented by Formula C:

(C)

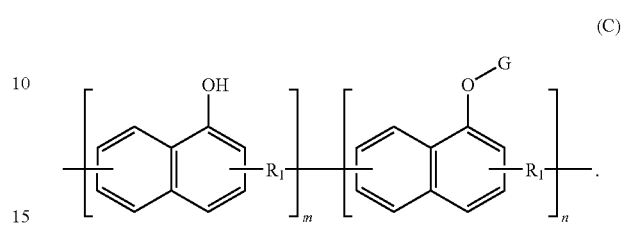

The naphthalene group may be unsubstituted or substituted, n may be at least 1 and may be less than about 750, m may be at least 1, and m+n may be less than about 750, G may be an aromatic ring-containing group having an alkoxy group, and $R_1$ may be methylene or may include an aryl linking group.

The naphthalene backbone may be substituted, such that Formula C is represented by Formula 3:

(3)

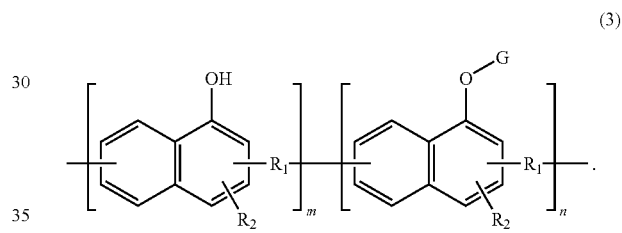

$R_2$ may be a hydroxyl, a hydrocarbon of about 10 carbons or less, or a halogen. $R_2$ may be the hydrocarbon of about 10 carbons or less, and the hydrocarbon of about 10 carbons or less may include a $C_1$-$C_{10}$ alkyl group, a $C_6$-$C_{10}$ aryl group, or an allyl group.

G may be:

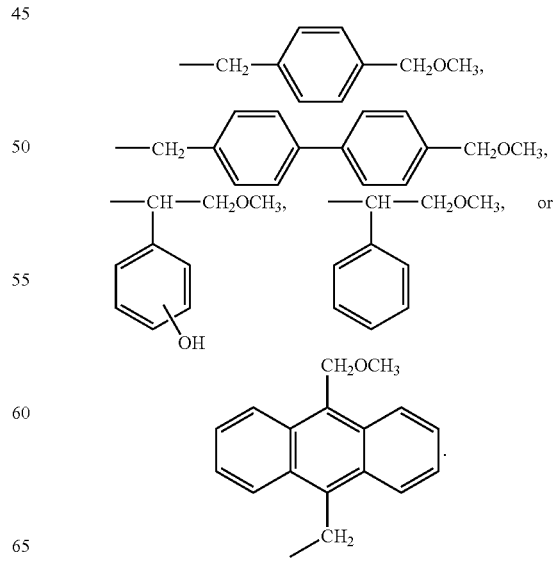

$R_1$ may be:

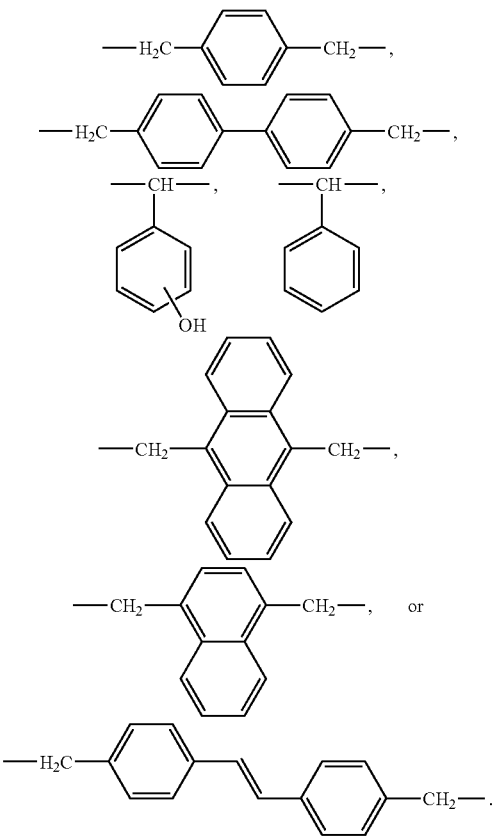

The polymer may have a weight average molecular weight of about 1,000 to about 30,000.

At least one of the above and other features and advantages may also be realized by providing an antireflective hardmask composition, including an organic solvent and at least one polymer represented by Formulae A, B or C:

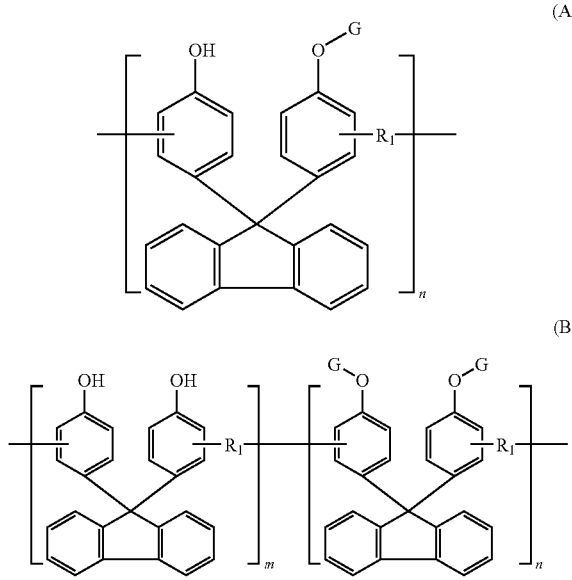

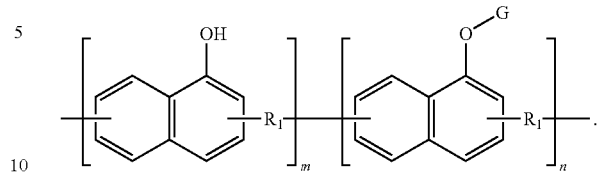

In Formulae A and B, the fluorene group may be unsubstituted or substituted, in Formula C, the naphthalene group may be unsubstituted or substituted, n may be at least 1 and may be less than about 750, m may be at least 1, and m+n may be less than about 750, G may be an aromatic ring-containing group having an alkoxy group, and $R_1$ may be methylene or a non-fluorene-containing aryl linking group.

The composition may include about 1 part to 30 parts by weight of the at least one polymer, based on 100 parts by weight of the organic solvent. The composition may further include a crosslinker and a catalyst. About 1% to about 20% of the weight of the composition may be the at least one polymer, about 75% to about 98.8% of the weight of the composition may be the organic solvent, about 0.1% to about 5% of the weight of the composition may be the crosslinker, and about 0.001% to about 0.05% of the weight of the composition may be the catalyst. The crosslinker may include one or more of an etherified amino resin, an N-methoxymethyl-melamine resin, an N-butoxymethyl-melamine resin, a methylated urea resin, a butylated urea resin, a glycoluril derivative, a 2,6-bis(hydroxymethyl)-p-cresol compound, or a bisepoxy compound.

At least one of the above and other features and advantages may also be realized by providing a process of patterning a material layer, including forming a hardmask layer using the composition according to an embodiment on the material layer, forming a radiation-sensitive imaging layer on the hardmask layer, patternwise exposing the imaging layer to radiation to form a pattern of radiation-exposed regions in the imaging layer, selectively removing portions of the imaging layer and the hardmask layer to expose portions of the material layer, and etching the portions of the material layer that are exposed through openings in the hardmask layer. The process may further include forming a silicon-containing hardmask layer after forming a hardmask layer and before forming the imaging layer. The process may further include forming a bottom antireflective hardmask layer on the silicon-containing hardmask layer prior to forming the imaging layer.

BRIEF DESCRIPTION OF THE DRAWINGS

The above and other features and advantages will become more apparent to those of ordinary skill in the art by describing in detail exemplary embodiments thereof with reference to the attached drawings, in which.

DETAILED DESCRIPTION OF THE INVENTION

Figure 1A:
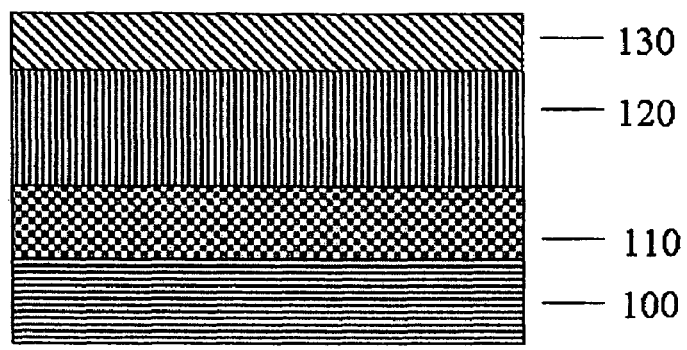
FIGS. 1A-1E illustrate stages in a method of fabricating a device using a hardmask composition according to an embodiment.

Korean Patent Application No. 10-2006-0131034, filed on Dec. 20, 2007, in the Korean Intellectual Property Office, and entitled: "Hardmask Composition Having Antireflective Properties, Process for Forming Patterned Material Layer by Using the Composition and Semiconductor Integrated Circuit Device Produced Using the Process," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an nth member, where n is greater than 3, whereas the expression "at least one selected from the group consisting of A, B, and C" does not.

As used herein, the expression "or" is not an "exclusive or" unless it is used in conjunction with the term "either." For example, the expression "A, B, or C" includes A alone; B alone; C alone; both A and B together; both A and C together; both B and C together; and all three of A, B and, C together, whereas the expression "either A, B, or C" means one of A alone, B alone, and C alone, and does not mean any of both A and B together; both A and C together; both B and C together; and all three of A, B and C together.

As used herein, the terms "a" and "an" are open terms that may be used in conjunction with singular items or with plural items. For example, the term "a catalyst" may represent a single compound, e.g., pyridinium p-toluenesulfonate, or multiple compounds in combination, e.g., pyridinium p-toluenesulfonate mixed with p-toluenesulfonic acid monohydrate.

As used herein, molecular weights of polymeric materials are weight average molecular weights, unless otherwise indicated.

Embodiments may provide an aromatic ring-containing polymer and hardmask composition including the aromatic ring-containing polymer, in which the refractive index and absorbance of a hardmask formed therewith are optimized for processing an underlying layer, such that the hardmask provides antireflective properties that may help to ensure a satisfactory lithography process margin. The polymer may include aromatic rings in the backbone. The aromatic rings may provide the polymer with a strong absorption in short wavelength regions, e.g., at 193 nm and/or 248 nm. The aromatic rings in the backbone may include reactive groups capable of reacting with a crosslinker and/or self-crosslinking.

In an embodiment, the aromatic ring-containing polymer may be a bis(phenyl)fluorene-backbone polymer represented by one of Formulae A or B, or a naphthalene-backbone polymer represented by Formula C:

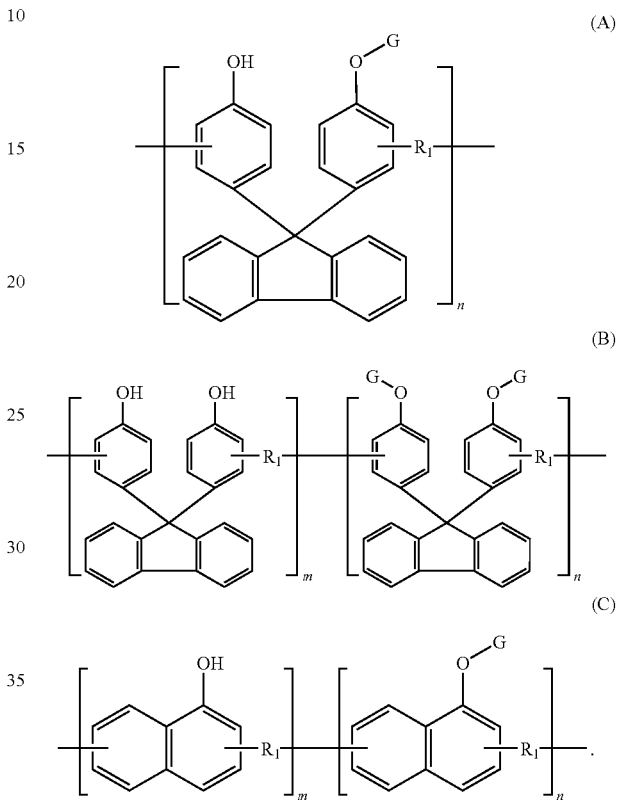

In Formulae A, B and C, group G may be an aromatic ring-containing group having an alkoxy group, e.g.,

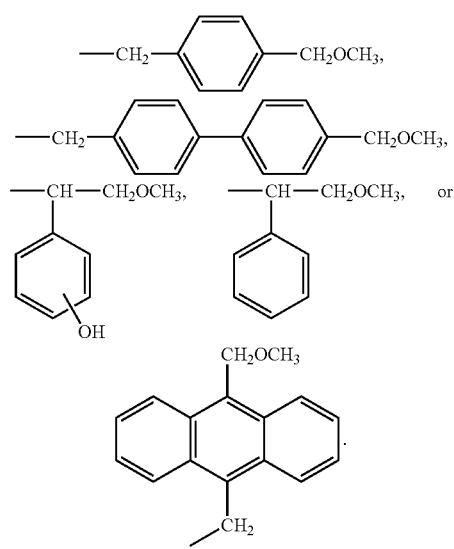

In Formulae A and B, $R_1$ may be methylene or include a non-fluorene containing aryl linking group, e.g.,

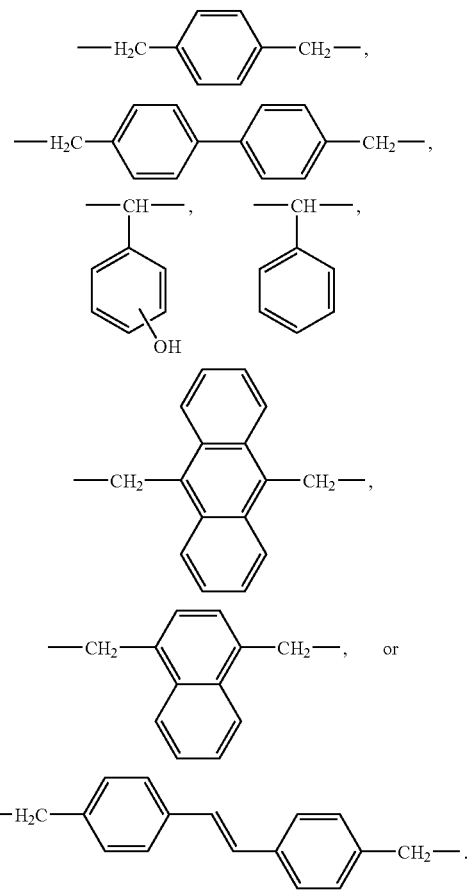

In Formula C, $R_1$ may be methylene or an aryl linking group, e.g.,

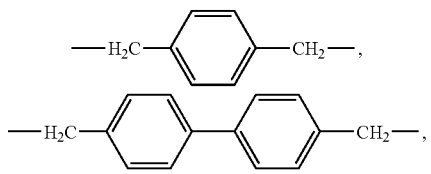

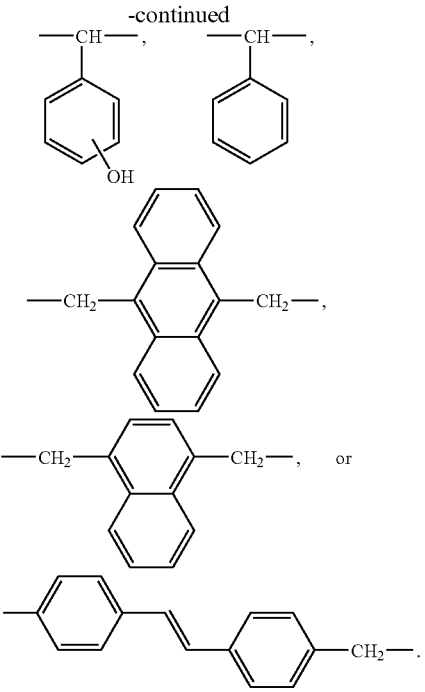

In Formula A, n may be at least 1 and may be less than about 750, i.e., $1 \leq n < 750$. In Formulae B and C, n may be at least 1 and less than about 750, n+m may be at least 2, and n+m may be less than about 750, i.e., $2 \leq m+n < 750$. The aromatic ring-containing polymers of Formulae A, B and C may have a weight average molecular weight of about 1,000 to about 30,000.

In Formulae A, B and C, the group G provides a reactive site (e.g., a methoxy group) capable of self-crosslinking with the hydroxyl groups of the polymers. Each of the aromatic group-containing polymers has a number of hydroxyl groups distributed along the backbone of the polymer and capable of reacting with a crosslinker and self-crosslinking with the groups G. In the polymers represented by Formulae B and C, the polymers may be random copolymers or block copolymers and, in the synthesis of the polymers, the groups G may be introduced prior to polymerization or following polymerization.

In an implementation, the aromatic ring-containing polymer may be a substituted polymer, in which the fluorene group of Formulae A and B is substituted, or in which the naphthalene group of Formula C is substituted, as represented by respective Formulae 1, 2, and 3, below:

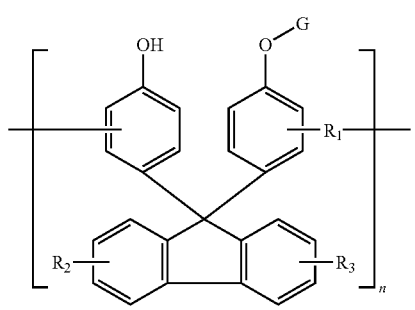

(1)

-continued

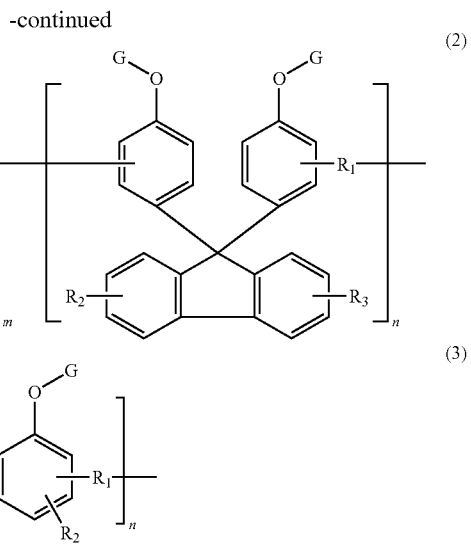

In Formulae 1 and 2, $R_2$ and $R_3$ may be, independently, hydrogen, hydroxyl, $C_1$-$C_{10}$ alkyl, $C_6$-$C_{10}$ aryl, allyl, or halogen. In Formula C, $R_2$ may be hydrogen, hydroxyl, $C_1$-$C_{10}$ alkyl, $C_6$-$C_{10}$ aryl, allyl, or halogen.

The hardmask composition according to an embodiment may include at least one of the aromatic ring-containing polymers represented by Formulae A, B, and C, e.g., at least one of Formulae 1, 2, or 3. The polymers represented by Formulae A, B, or C may impart the hardmask composition with a strong absorption in the short wavelength region, e.g., 193 nm and/or 248 nm, and may be cured through self-crosslinking between the groups G and the hydroxyl groups of the polymer. In addition, the hardmask composition may exhibit solution- and film-forming characteristics that may assist in the formation of a layer when using a conventional spin-coating technique.

In an implementation, the hardmask composition may further include one or more of a crosslinker, a catalyst, an organic solvent, or a surfactant. Where the hardmask composition includes the crosslinker, the hardmask composition may be cured through crosslinking between the crosslinker and the hydroxyl groups of the polymer, as well as through self-crosslinking between the groups G and the hydroxyl groups of the polymer.

Where the hardmask composition includes an organic solvent, the total amount of aromatic ring-containing polymer included in the composition may be about 1 part to about 30 parts by weight, based on 100 parts by weight of the organic solvent. Where the hardmask composition includes the organic solvent, the crosslinker, and the catalyst, the total amount of the aromatic ring-containing polymer may be about 1% to about 20% of the weight of the composition, preferably about 3% to about 10% of the weight, the crosslinker may be about 0.1% to about 5% of the weight of the composition, preferably about 0.1% to about 3% of the weight, the catalyst may be about 0.001% to about 0.05% of the weight of the composition, preferably about 0.001% to about 0.03% of the weight, and the organic solvent may be about 75% to about 98.8% of the weight of the composition.

When the relative proportions of the aromatic ring-containing polymer and the solvent are outside the range described above, it may be difficult to accurately regulate the coating thickness, such that a desired coating thickness may be difficult to obtain. Using about 0.1% by weight or more of the crosslinker may help ensure satisfactory crosslinking, and using about 5% by weight or less may help avoid deformation of the pattern profile, and avoid redeposition contamination caused by volatile components that evolve upon baking. Using about 0.001% by weight or more of the catalyst may help ensure satisfactory crosslinking, and using about 0.05% by weight or less may impart the composition with good storage stability.

The crosslinker may be capable of reacting with the hydroxyl groups of the aromatic ring-containing polymer in the presence of the catalyst, and may include one or more of, e.g., bisepoxy compounds, etherified amino resins, methylated melamine resins and butylated melamine resins such as N-methoxymethyl melamine resins and N-butoxymethyl-melamine resins, methylated urea resins and butylated urea resins such as cymel U-65 and UFR 80, glycoluril derivatives such as Powderlink® 1174 (manufactured by Cytec Industries, Inc. (U.S.A.) and illustrated in Formula 4, below), 2,6-bis(hydroxymethyl)-p-cresol, etc.

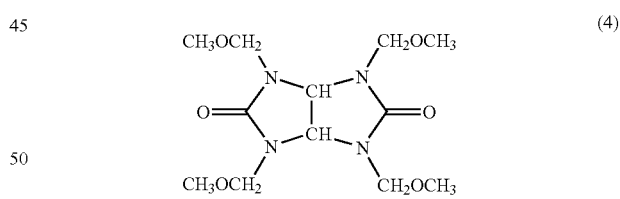

The catalyst may include one or more of, e.g., ammonium hydroxides such as $NH_4OH$ and $NR_4OH$, where R is alkyl, 2-methylimidazole, p-toluenesulfonic acid monohydrate, pyridinium p-toluenesulfonate, etc. For improved storage stability, a thermal acid generator (TAG) compound, i.e., a compound that generates an acid upon thermal treatment, may be used as the catalyst. Examples of preferred TAGs include pyridinium p-toluenesulfonate, 2,4,4,6-tetrabromocyclohexadienol, benzoin tosylate, 2-nitrobenzyl tosylate, and alkyl esters of organic sulfonic acids. Radiation-sensitive acid catalysts used for resists that are compatible with the other components of the hardmask composition may also be used.

The organic solvent may be any suitable solvent that sufficiently dissolves the aromatic ring-containing polymer, e.g., propylene glycol monomethyl ether acetate (PGMEA), propylene glycol monomethyl ether (PGME), cyclohexanone, ethyl lactate, etc.

Figure 1B:
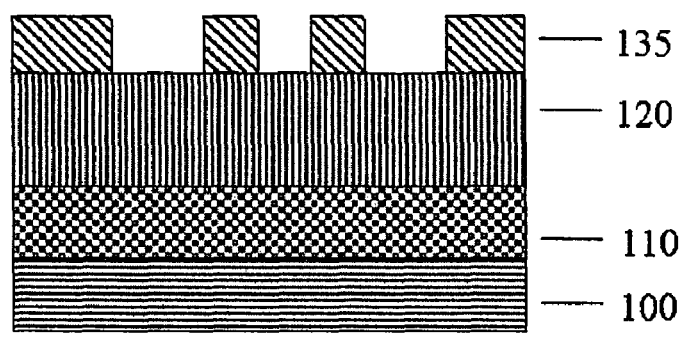
Figure 1C:
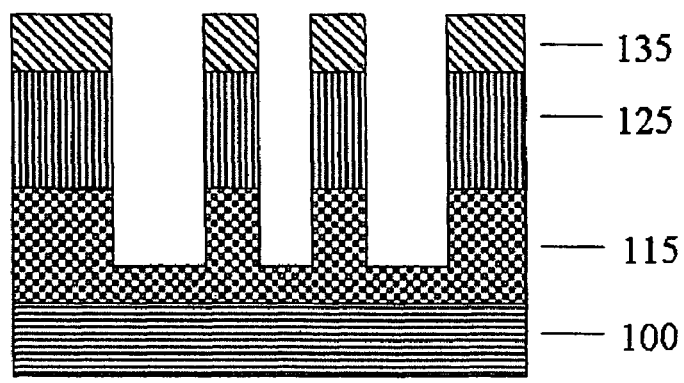

An embodiment provides a process for patterning a material layer on a substrate using the hardmask composition formed on the material layer. The process may include providing a material layer, e.g., a substrate having the material layer thereon, forming a hardmask layer using the composition according to an embodiment on the material layer, forming a radiation-sensitive imaging layer on the hardmask layer, patternwise exposing the imaging layer to radiation to form a pattern of radiation-exposed regions in the imaging layer, selectively removing portions of the imaging layer and the hardmask layer to expose portions of the material layer, and etching the portions of the material layer that are exposed through openings in the hardmask layer to pattern the material layer. For example, referring to FIG. 1A, the process of fabricating a device using a hardmask composition according to an embodiment may include providing a substrate 100 having a target material layer 110, e.g., a metal layer such as aluminum, or a silicon nitride (SiN) layer, forming a hardmask layer 120 on the target material layer 110, and forming an imaging layer 130, e.g., a photoresist layer, on the hardmask layer 120. Referring to FIGS. 1B and 1C, the imaging layer 130 may then be exposed and developed to yield a patterned imaging layer 135, after which the hardmask layer 120 and the target material layer 110 may be sequentially processed to form a hardmask pattern 125 and a patterned material layer 115.

As a particular example, the process may be carried out in accordance with the following procedure. First, a material to be patterned may be applied to a substrate, e.g., a silicon substrate, by a general technique. The material to be patterned may be an electrically conductive, semi-conductive, magnetic, or insulating material, e.g., aluminum, silicon nitride, etc. Thereafter, the hardmask composition according to an embodiment may be spin-coated, e.g., to a thickness of about 500 Å to about 4,000 Å, and baked to form a hardmask layer, e.g., baked at about 100° C. to about 300° C. for about 10 seconds to about 10 minutes. The radiation-sensitive imaging layer may then be formed on the hardmask layer. Exposure and developing of the imaging layer may then be conducted to form openings corresponding to where a pattern is to be formed, i.e., the imaging layer and the hardmask layer may be selectively removed to expose portions of the material layer. The material layer may then be etched, e.g., using dry etching with an etching gas such as a mixed gas of $CHF_3/CF_4$, to form a patterned material layer, with the hardmask serving to protect unexposed portions of the material layer. Thereafter, the remaining portions of the resist may be removed using a common photoresist stripper. The patterned hardmask, i.e., the polymerized composition including one or more cross-linked polymers according to an embodiment, may be removed. A semiconductor integrated circuit device, an optical or electro-optical device, a microelectromechanical (MEMS) device, etc., may thus be provided.

Figure 1D:
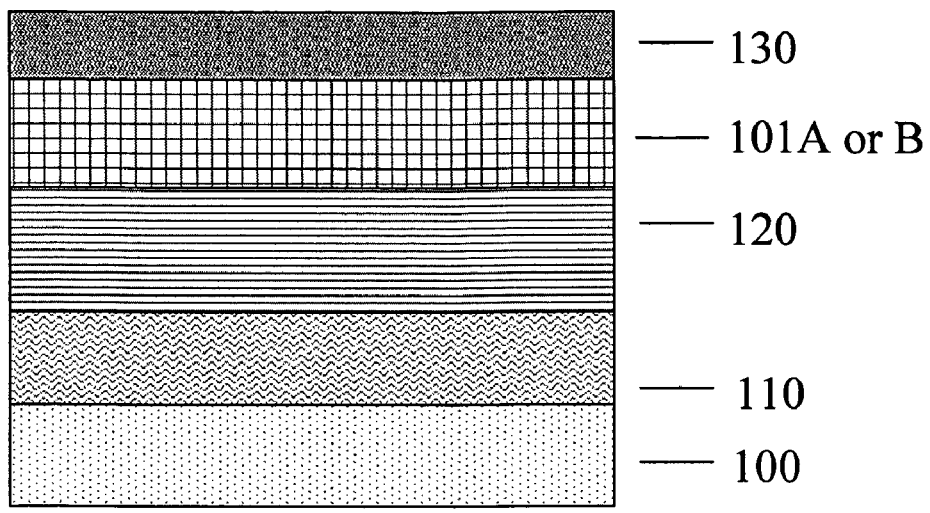
Figure 1E:
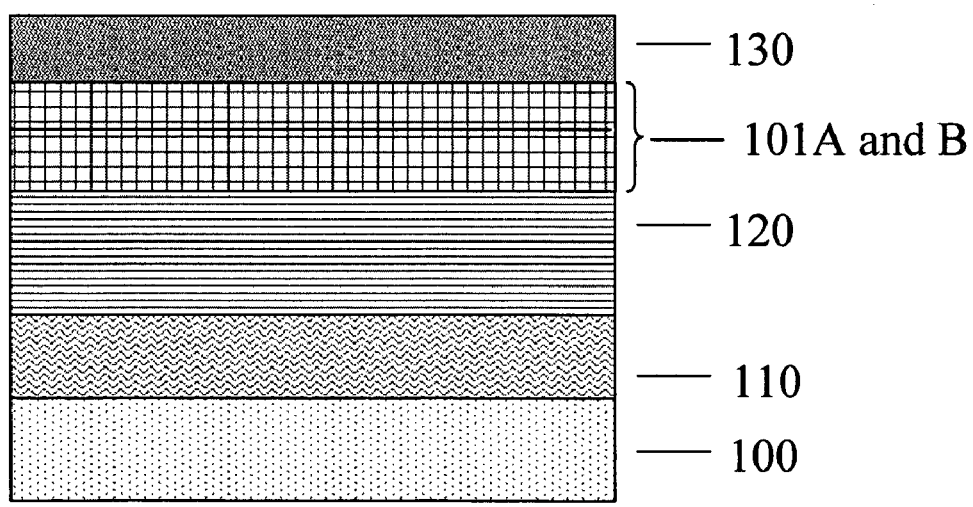

Referring to FIG. 1D, in an implementation, the process may further include forming a silicon-containing hardmask layer 101A or a bottom antireflective hardmask layer (BARC) 101B prior to forming the imaging layer 130, e.g., after forming the hardmask layer 120 according to an embodiment, and prior to forming the imaging layer 130. Referring to FIG. 1E, in an implementation, the bottom antireflective hardmask layer 101B may be formed on the silicon-containing hardmask layer 101A prior to forming the imaging layer 130, e.g., after forming the hardmask layer 120 according to an embodiment, and prior to forming the imaging layer 130.

The hardmask composition and the lithographic structure formed using the composition may be used in the fabrication and design of integrated circuit devices in accordance with general semiconductor manufacturing processes. For example, the composition may be used in the formation of patterned material layer structures such as metal wiring, holes for contacts and biases, insulating sections such as damascene trenches and shallow trench isolation (STI) structures, trenches for capacitor structures, etc.

The following Examples and Comparative Examples are provided in order to set forth particular details of one or more embodiments. However, it will be understood that the embodiments are not limited to the particular details described.

EXAMPLES

Synthesis Example 1

Synthesis of copolymer of 9,9-bis(hydroxyphenyl)fluorene and 1,4-bis(methoxymethyl)benzene 350.41 g (1.0 mol) of 9,9-bis(hydroxyphenyl)fluorene, 3.08 g (0.02 mol) of diethyl sulfate and 350 g of propylene glycol monomethyl ether acetate were completely dissolved with stirring in a 3 liter four-neck flask, equipped with a mechanical agitator and a condenser, while maintaining the temperature of the flask at 115° C. 10 minutes after the dissolution, 166.22 g (1.0 mol) of 1,4-bis(methoxymethyl)benzene (molar ratio of 9,9-bis(hydroxyphenyl)fluorene:1,4-bis(methoxymethyl)benzene=1:1) was dropped into the solution, and then the resulting mixture was allowed to react at the same temperature for 15 hours. 2.98 g (0.02 mol) of triethanolamine was then added as a neutralizing agent to quench the reaction. After completion of the reaction, a mixture of water and methanol was used to remove acid from the reaction mixture, and methanol was used to remove low molecular weight compounds, e.g., oligomers and monomers, to yield a polymer represented by Formula 5 below ($M_w$=10,000, polydispersity=2.0, n=17).

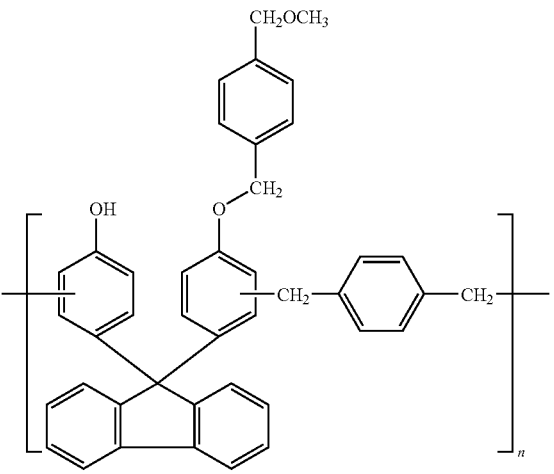

(5)

Synthesis Example 2

Synthesis of copolymer of 9,9-bis(hydroxyphenyl)fluorene and 4,4'-bis(methoxymethyl)biphenyl A copolymer was synthesized in the same manner as in Synthesis Example 1, except that 242.31 g (1 mol) of bis (methoxymethyl)biphenyl was used instead of 166.22 g of 1,4-bis(methoxymethyl)benzene. The copolymer is represented by Formula 6 below:

(6)

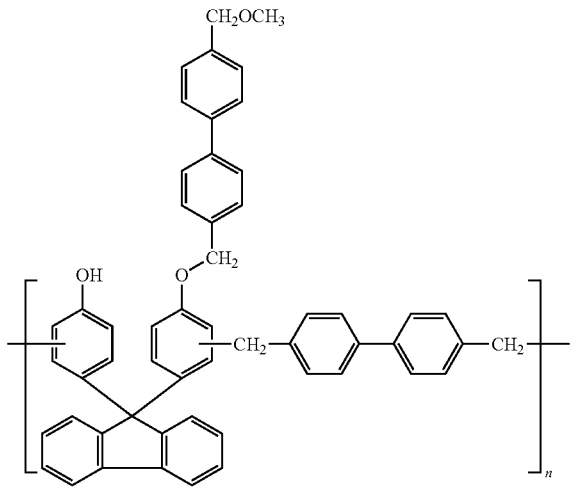

The molecular weight and the polydispersity of the copolymer were measured by gel permeation chromatography (GPC) in tetrahydrofuran, and were determined to be $M_w=11,000$ (n=20) and polydispersity=2.0.

Synthesis Example 3

Synthesis of copolymer of 1-naphthol and 9,10-bis(methoxymethyl)anthracene

A copolymer was synthesized in the same manner as in Synthesis Example 1, except that 144.17 g (1 mol) of 1-naphthol and 266.33 g (1 mol) of 9,10-bis(methoxymethyl)anthracene were used instead of 350.41 g (1.0 mol) of 9,9-bis(hydroxyphenyl)fluorene and 166.22 g of 1,4-bis(methoxymethyl)benzene, respectively. The copolymer is represented by Formula 7 below:

The molecular weight and the polydispersity of the copolymer were measured by GPC in tetrahydrofuran, and were determined to be $M_w=10,000$ (n+m=17) and a polydispersity=2.1.

Examples 1 to 3

0.8 g of each of the polymers prepared in Synthesis Examples 1 to 3, 0.2 g of a crosslinker (Powderlink® 1174) and 2 mg of pyridinium p-toluenesulfonate were dissolved in 9 g of propylene glycol monomethyl ether acetate (PGMEA), and filtered to prepare respective sample solutions. Each of the respective sample solutions of Examples 1 to 3 was spin-coated on a silicon wafer and baked at 200° C. for 60 seconds to form a 4,000 Å-thick film. The refractive index (n) and extinction coefficient (k) of the films were measured using an ellipsometer (J. A. Woollam Co., Inc. (U.S.A.)). The results are shown in Table 1, and indicate that the films are suitable for use as antireflective films at 193 nm (ArF source) and 248 nm (KrF source).

Synthesis Example 4

Synthesis of copolymer of 9,9-bis(hydroxyphenyl)fluorene and 1,4-bis(methoxymethyl)benzene A copolymer was synthesized in the same manner as in Synthesis Example 1, except that only 116.35 g (0.7 mol) of 1,4-bis(methoxymethyl)benzene was used instead of 166.22 g (1 mol) of 1,4-bis(methoxymethyl)benzene. The copolymer is represented by Formula 8 below:

(8)

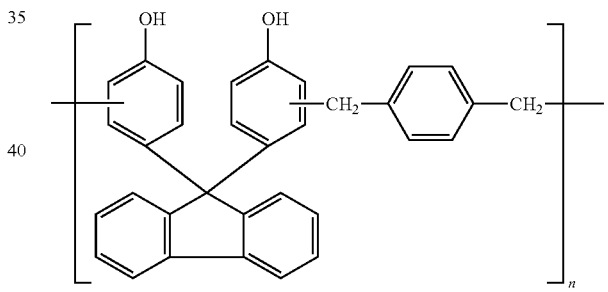

(7)

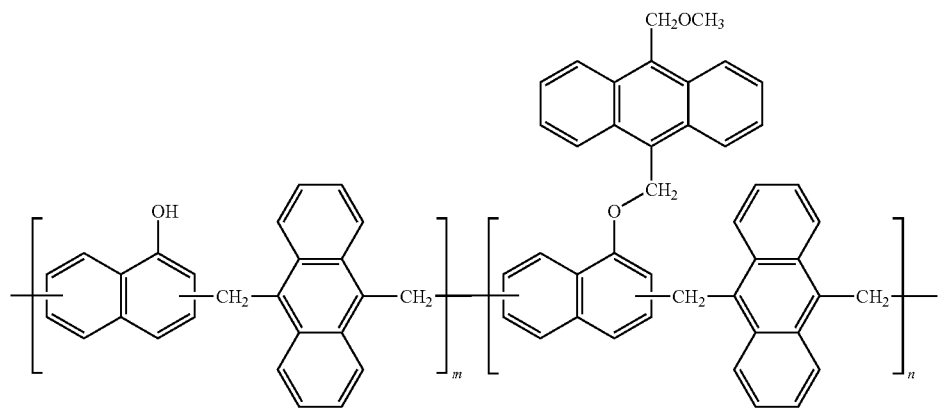

The molecular weight and the polydispersity of the copolymer were measured by GPC in tetrahydrofuran, and were determined to be $M_w=10,000$ (n=17) and a polydispersity=1.9.

Comparative Example 1

A film was formed in the same manner as in Examples 1 to 3, except that the polymer prepared in Synthesis Example 4 was used. The film was measured for refractive index (n) and extinction coefficient (k). The results are also shown in Table 1.

TABLE 1

| Sample used in the formation of film | Optical properties (193 nm) | | Optical properties (248 nm) | |
|---|---|---|---|---|
| | Refractive index (n) | Extinction coefficient (k) | Refractive index (n) | Extinction coefficient (k) |
| Example 1 | 1.47 | 0.68 | 1.91 | 0.21 |
| Example 2 | 1.43 | 0.31 | 2.12 | 0.30 |
| Example 3 | 1.44 | 0.74 | 1.82 | 0.05 |
| Comparative Example 1 | 1.43 | 0.69 | 1.97 | 0.27 |

Examples 4 to 6

Each of the sample solutions prepared in Examples 1 to 3 was spin-coated on a silicon wafer covered with silicon nitride and baked at 200° C. for 60 seconds to form a 4,000 Å-thick film. A silicon antireflective coating (ARC) was formed on the film and baked at 240° C. for 60 seconds. Thereafter, an ArF photoresist was coated to a thickness of 1,700 Å A on the silicon ARC, baked at 110° C. for 60 seconds, exposed to light using an ArF exposure system (ASML Netherlands B.V., XT: 1400, NA 0.93), and developed with an aqueous solution of TMAH (2.38 wt %) to form a 63-nm line and space pattern. The patterns were observed using a field emission scanning electron microscope (FE-SEM), and were measured for exposure latitude (EL) margin as a function of exposure energy and depth of focus (DoF) margin as a function of the distance from a light source. The results are shown in Table 2.

Comparative Example 2

A pattern was formed in the same manner as in Examples 4 to 6, except that the sample solution prepared in Comparative Example 1 was used. The profile of the pattern was observed, and was measured for exposure latitude (EL) and depth of focus (DoF). The results are also shown in Table 2. There was no significant difference in pattern profile and margins between the patterns formed in Examples 1 to 3 and in Comparative Example 2.

TABLE 2

| Sample used in the formation of film | Pattern properties | | |
|---|---|---|---|
| | EL margin (Δ mJ/exposure energy mJ) | DoF margin (μm) | Profile |
| Example 4 | 4 | 0.25 | Cubic |
| Example 5 | 4 | 0.25 | Cubic |
| Example 6 | 4 | 0.25 | Cubic |
| Comparative Example 2 | 4 | 0.25 | Cubic |

Examples 7 to 9

Each of the silicon ARCs of the patterned specimens, i.e., Examples 4 to 6, was dry-etched using a mixed gas of $CHF_3/CF_4$ through a photoresist as a mask. The hardmask was dry-etched using a mixed gas of $O_2/N_2$ through the silicon ARC as a mask. Thereafter, the silicon nitride underlying the hardmask was dry-etched using a mixed gas of $CHF_3/CF_4$, using the hardmask as a mask. $O_2$ ashing and wet stripping were performed on the remaining portions of the hardmask and the organic material. Immediately after etching of the hardmask and the silicon nitride, the cross-sections of the specimens were observed using an FE-SEM. The results are shown in Table 3. The etched patterns all showed good profiles in the silicon nitride, which is believed to be because the hardmasks according to embodiments were sufficiently resistant to the etching gas.

Comparative Example 3

The specimen formed in Comparative Example 2 was etched to form a pattern in accordance with the procedure described above in connection with Examples 7 to 9. The pattern was observed, and the results are also shown in Table 3. The pattern showed an isotropic (bowed) etching profile after etching of the hardmask, which may result in tapering of the pattern upon etching of the silicon nitride.

TABLE 3

| Sample used in the formation of film | Pattern shape after etching of hardmask | Pattern shape after etching of silicon nitride |
|---|---|---|
| Example 7 | Vertical (Anisotropic) | Vertical (Anisotropic) |
| Example 8 | Vertical (Anisotropic) | Vertical (Anisotropic) |
| Example 9 | Vertical (Anisotropic) | Vertical (Anisotropic) |
| Comparative Example 3 | Bowed | Tapered |

The polymer and hardmask composition according to embodiments may be used in lithography, and may provide excellent optical and mechanical properties. As described above, the hardmask composition may be used to form a film having a refractive index and an absorbance suitable for use as an antireflective film in the deep UV (DUV) region, e.g., 193 nm (ArF) and/or 248 nm (KrF), and may significantly reduce reflectivity between a resist and an underlying layer. The hardmask composition may be used to provide a lithographic structure with good pattern profiles and process margins. The composition according to an embodiment may be highly resistant to dry etching, may exhibit high etch selectivity, may be resistant to multiple etching operations during lithography, and may be used to form a hardmask having a very good etch profile. For example, referring again to Example 7 and Formula 5, the hydroxy group may form a bridge with $CH_3OCH_2C_6H_4CH_2O$—, which may result in an improved pattern shape after etching using the hardmask according to an embodiment. Therefore, the composition may be used to provide a multilayer thin film that is patterned with high aspect ratio, and a good image may be transferred to an underlying layer. In addition, the composition may be readily applied by spin-on application techniques.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the invention as set forth in the following claims.

What is claimed is:

1. A bis(phenyl)fluorene-backbone polymer represented by Formula A or B:

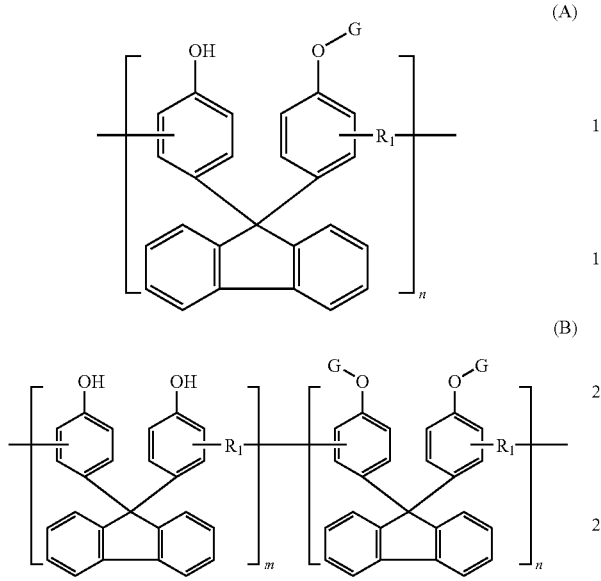

wherein:
the fluorene group is unsubstituted or substituted,
n is at least 1 and is less than about 750,
m is at least 1, and m+n is less than about 750,
G is an aromatic ring-containing group having an alkoxy group, and
$R_1$ is methylene or includes a non-fluorene-containing aryl linking group.

2. The polymer as claimed in claim 1, wherein:
the fluorene group is substituted, such that Formulas A and B are respectively represented by Formulae 1 and 2:

$R_2$ and $R_3$ are independently a hydroxyl, a hydrocarbon of about 10 carbons or less, or a halogen.

3. The polymer as claimed in claim 2, wherein:
at least one of $R_2$ and $R_3$ is the hydrocarbon of about 10 carbons or less, and
the hydrocarbon of about 10 carbons or less includes a $C_1$-$C_{10}$ alkyl group, a $C_6$-$C_{10}$ aryl group, or an allyl group.

4. The polymer as claimed in claim 1, wherein G is:

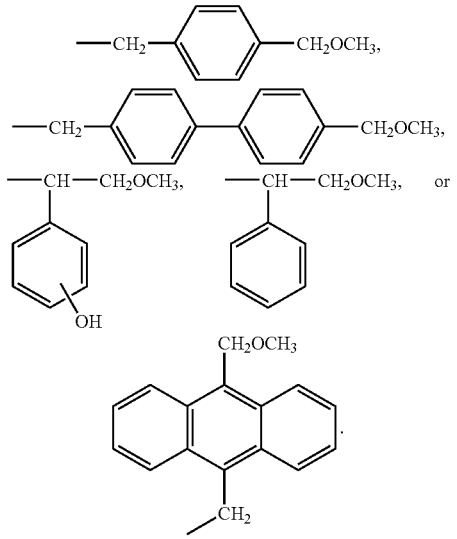

5. The polymer as claimed in claim 1, wherein $R_1$ is:

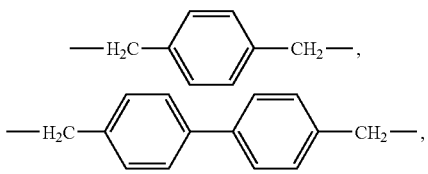

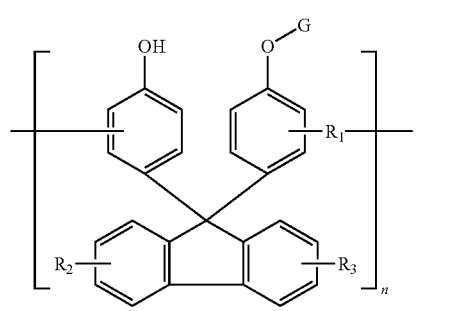

(1)

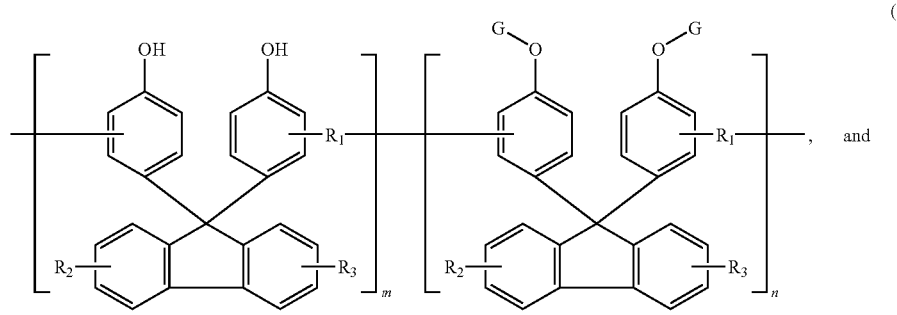

(2)

-continued

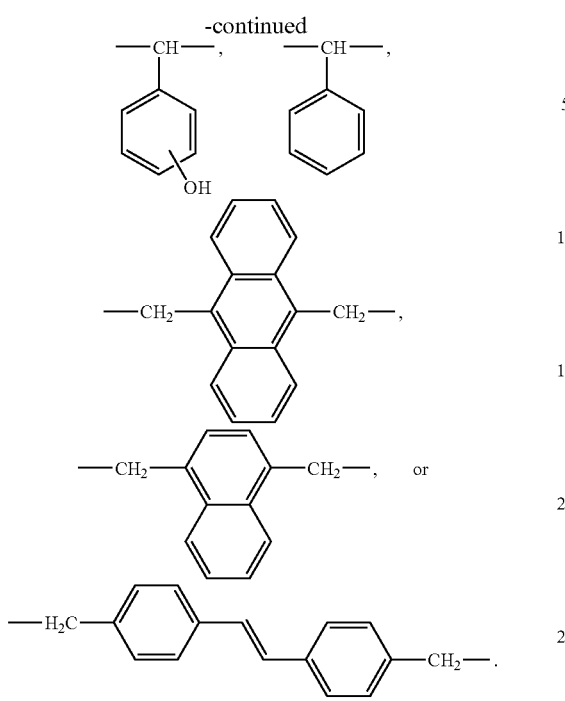

6. The polymer as claimed in claim 1, wherein the polymer has a weight average molecular weight of about 1,000 to about 30,000.

7. A naphthalene-backbone polymer represented by Formula C:

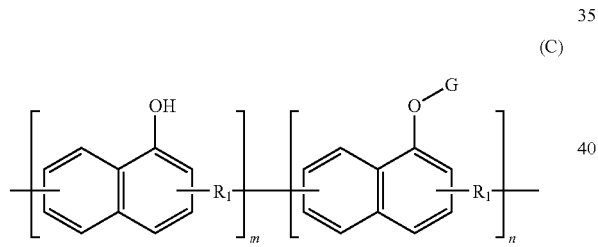

(C)

wherein:
the naphthalene group is unsubstituted or substituted,
n is at least 1 and is less than about 750,
m is at least 1, and m+n is less than about 750,
G is an aromatic ring-containing group having an alkoxy group, and
$R_1$ is methylene or includes an aryl linking group.

8. The polymer as claimed in claim 7, wherein:
the naphthalene backbone is substituted, such that Formula C is represented by Formula 3:

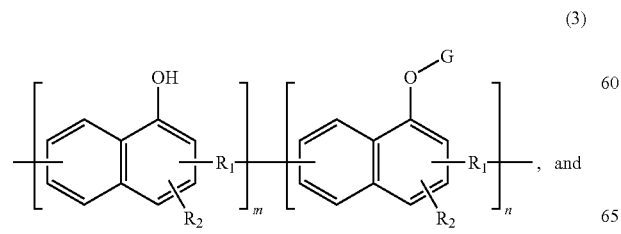

(3)

, and $R_2$ is a hydroxyl, a hydrocarbon of about 10 carbons or less, or a halogen.

9. The polymer as claimed in claim 8, wherein:
$R_2$ is the hydrocarbon of about 10 carbons or less, and
the hydrocarbon of about 10 carbons or less includes a $C_1$-$C_{10}$ alkyl group, a $C_6$-$C_{10}$ aryl group, or an allyl group.

10. The polymer as claimed in claim 7, wherein G is:

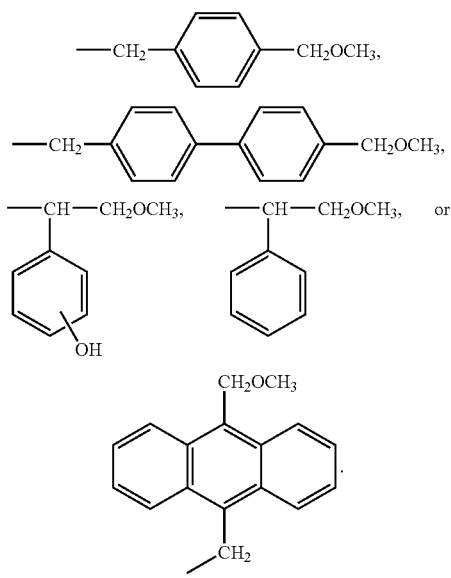

11. The polymer as claimed in claim 7, wherein $R_1$ is:

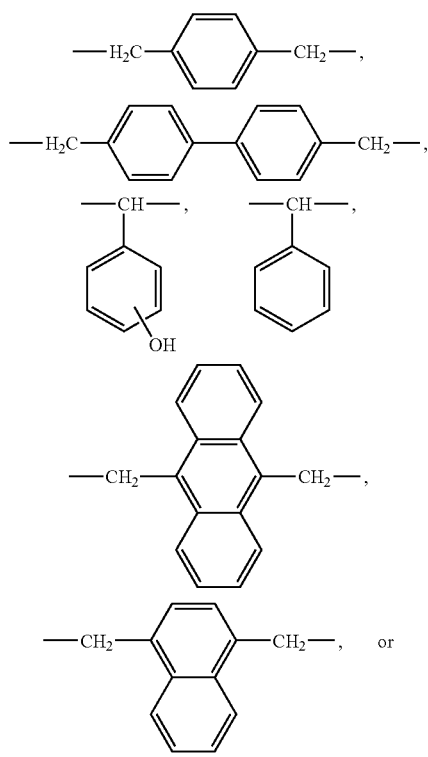

-continued

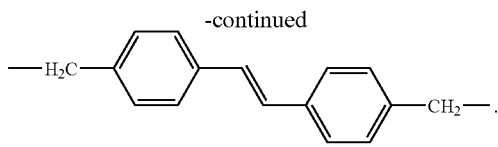

12. The polymer as claimed in claim 7, wherein the polymer has a weight average molecular weight of about 1,000 to about 30,000.

13. An antireflective hardmask composition, comprising:
an organic solvent; and
at least one polymer represented by Formulae A, B or C:

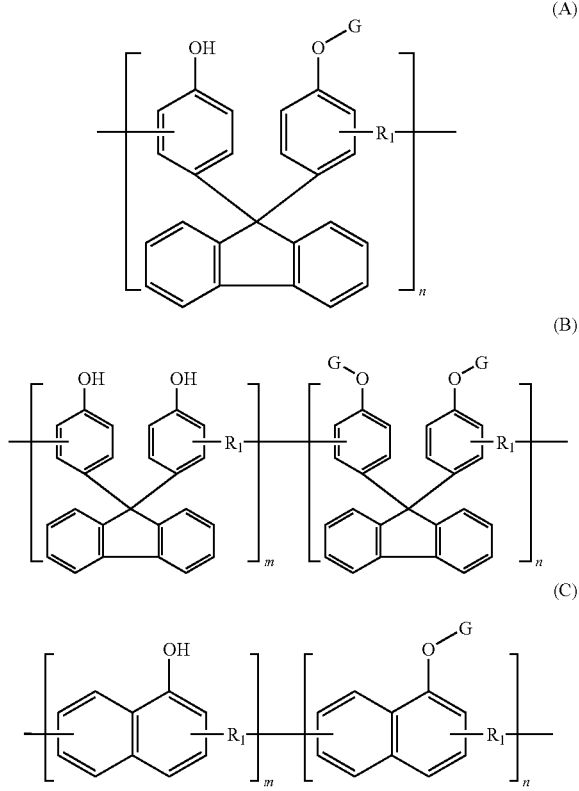

wherein:
in Formulae A and B, the fluorene group is unsubstituted or substituted, in Formula C, the naphthalene group is unsubstituted or substituted, n is at least 1 and is less than about 750, m is at least 1, and m+n is less than about 750, G is an aromatic ring-containing group having an alkoxy group, and $R_1$ is methylene or a non-fluorene-containing aryl linking group.

14. The composition as claimed in claim 13, wherein the composition includes about 1 part to 30 parts by weight of the at least one polymer, based on 100 parts by weight of the organic solvent.

15. The composition as claimed in claim 13, further comprising a crosslinker and a catalyst, wherein:
about 1% to about 20% of the weight of the composition is the at least one polymer,
about 75% to about 98.8% of the weight of the composition is the organic solvent,
about 0.1% to about 5% of the weight of the composition is the crosslinker, and
about 0.001% to about 0.05% of the weight of the composition is the catalyst.

16. The composition as claimed in claim 13, further comprising a crosslinker, wherein the crosslinker includes one or more of an etherified amino resin, an N-methoxymethyl-melamine resin, an N-butoxymethyl-melamine resin, a methylated urea resin, a butylated urea resin, a glycoluril derivative, a 2,6-bis(hydroxymethyl)-p-cresol compound, or a bisepoxy compound.

17. A process of patterning a material layer, the process comprising:
forming a hardmask layer using the composition according to claim 13 on the material layer;
forming a radiation-sensitive imaging layer on the hardmask layer;
patternwise exposing the imaging layer to radiation to form a pattern of radiation-exposed regions in the imaging layer;
selectively removing portions of the imaging layer and the hardmask layer to expose portions of the material layer; and
etching the portions of the material layer that are exposed through openings in the hardmask layer.

18. The process as claimed in claim 17, further comprising forming a silicon-containing hardmask layer after forming a hardmask layer and before forming the imaging layer.

19. The process as claimed in claim 18, further comprising forming a bottom antireflective hardmask layer on the silicon-containing hardmask layer prior to forming the imaging layer.

* * * * *